US006835509B2

(12) United States Patent
Lee

(10) Patent No.: US 6,835,509 B2
(45) Date of Patent: Dec. 28, 2004

(54) MASK FOR ESTIMATING ABERRATION IN PROJECTION LENS SYSTEM OF EXPOSURE APPARATUS

(75) Inventor: Sung-Woo Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 107 days.

(21) Appl. No.: 10/295,843

(22) Filed: Nov. 18, 2002

(65) Prior Publication Data

US 2003/0207181 A1 Nov. 6, 2003

(30) Foreign Application Priority Data

May 2, 2002 (KR) .......................................... 2002-24197

(51) Int. Cl.[7] .............................................. G03F 9/00
(52) U.S. Cl. ......................................................... 430/5
(58) Field of Search .............................. 430/5; 356/124

(56) References Cited

U.S. PATENT DOCUMENTS

2003/0123052 A1 * 7/2003 Ausschnitt et al. ......... 356/124

* cited by examiner

Primary Examiner—S. Rosasco
(74) Attorney, Agent, or Firm—Harness Dickey

(57) ABSTRACT

A mask for estimating aberration in a projection lens system of an exposure apparatus. The mask includes a mask substrate and mask patterns arranged on the mask substrate such that a critical dimension (CD), represented by the width of each of the mask patterns, and a phase of the mask patterns have a size proportional to a SINC function. Preferably the distance between the centers of the mask patterns is substantially uniform. The size and phase of light transmitted to the projection lens system during an exposure step are substantially uniform such that the aberration value in each portion of the projection lens system depending on each of the mask patterns is substantially not distorted and is substantially uniform.

15 Claims, 3 Drawing Sheets

MASK FOR ESTIMATING ABERRATION IN PROJECTION LENS SYSTEM OF EXPOSURE APPARATUS

CROSS-REFERENCE TO RELATED APPLICATIONS

This non-provisional application claims priority under 35 U.S.C. §119 to Korean Patent Application No. 02-24197 filed May 2, 2002, the contents of which are incorporated herein by reference.

BACKGROUND OF THE INVENTION

1. Field of the Invention

The present invention relates generally to a mask used in an exposure apparatus, and more particularly, to a mask for estimating aberration in a projection lens system of an exposure apparatus.

2. Description of the Related Art

Typically, an exposure apparatus is used to form photoresist patterns on a semiconductor wafer in the manufacture of semiconductor devices. Specifically, the exposure apparatus is used to realize patterns on a mask on a photoresist layer. A projection lens system, which reduces and projects patterns on a mask on a semiconductor wafer using light characteristics, is installed in the exposure apparatus. Thus, an estimation of aberration in the projection lens system of the exposure apparatus is necessary.

Referring to FIG. 1, a conventional method for estimating aberration in a projection lens system of an exposure apparatus can best be seen. The mask 11 for estimating is divided into a portion marked with the letter "K". FIG. 2 is an enlarged view of the section "K" of FIG. 1 and shows where a lens array 19 and a transparent layer 21 are formed.

In FIG. 1, reference numeral 13 denotes the mask plane (i.e., mask surface). Light emitted from a light source in the exposure apparatus passes through lenses 16a and 16b of a projection lens system 15, and image patterns are formed on an image plane 17 of a semiconductor wafer.

Light A', C', E', A", C", and E" passing through a portion of the mask 11 in which the transparent layer 21 is not formed creates reference pattern 23 with respect to the entire projection lens system 15 in the image plane 17. Light A, B, C, D, and E traveling through a portion of the mask 11 in which the transparent layer 21 is formed, passes through a desired position of the projection lens system 15 through a pin hole 25 of the transparent layer 21 and forms measurement pattern 27.

In particular, light marked D in FIG. 1 is light passing through the projection lens system 15 without aberration, and light marked $D_{ab}$ is light passing through the projection lens system 15 with aberration. The aberration is estimated by comparing the reference pattern 23 with the measurement pattern 27. In FIG. 1, reference numerals 29 and 31 denote an aperture plane and an aperture stop, respectively.

The lens array 19 should be manufactured at the backside of a mask that is used in the conventional method for estimating aberration in the projection lens system of the exposure apparatus. In addition, the transparent layer 21 in which the pin hole 25 is formed should be manufactured at the front side of the mask. Further, it costs a great deal to manufacture the mask used in the conventional method for estimating aberration in a projection lens system of an exposure apparatus. Consequently, it is therefore desirable to provide a mask for estimating aberration in a projection lens that overcomes the disadvantages of the known prior art.

SUMMARY OF THE INVENTION

At least one exemplary embodiment of the present invention provides a mask for estimating aberration in a projection lens system of an exposure apparatus by changing mask patterns.

In at least one exemplary embodiment of the present invention there is provided a mask for estimating aberration in a projection lens system of an exposure apparatus. The mask includes a mask substrate and mask patterns arranged on the mask substrate such that a critical dimension (CD), represented by the width of each of the mask patterns, and a phase of the mask patterns have a size proportional to a SINC function. Preferably, the distance between the centers of the mask patterns is substantially uniform. The phase of each of the mask patterns may be provided by etching the mask substrate.

According to at least one exemplary embodiment of the present invention, the size and phase of light transmitted to the projection lens system during an exposure step are substantially uniform, and thus an aberration value in each portion of the projection lens system depending on each mask pattern is not distorted and is uniform.

BRIEF DESCRIPTION OF THE DRAWINGS

The present invention will become more apparent by describing in detail exemplary embodiments thereof with reference to the attached drawings in which.

DETAILED DESCRIPTION OF THE INVENTION

The present invention will be described more fully hereinafter with reference to the accompanying drawings in which exemplary embodiments of the invention are shown. This invention may, however, be embodied in many different forms and should not be construed as being limited to the exemplary embodiments set forth herein. Rather, these exemplary embodiments are provided so that this disclosure will be thorough and complete and will fully convey the scope and concepts of the present invention to those skilled in the art.

Figure 1:
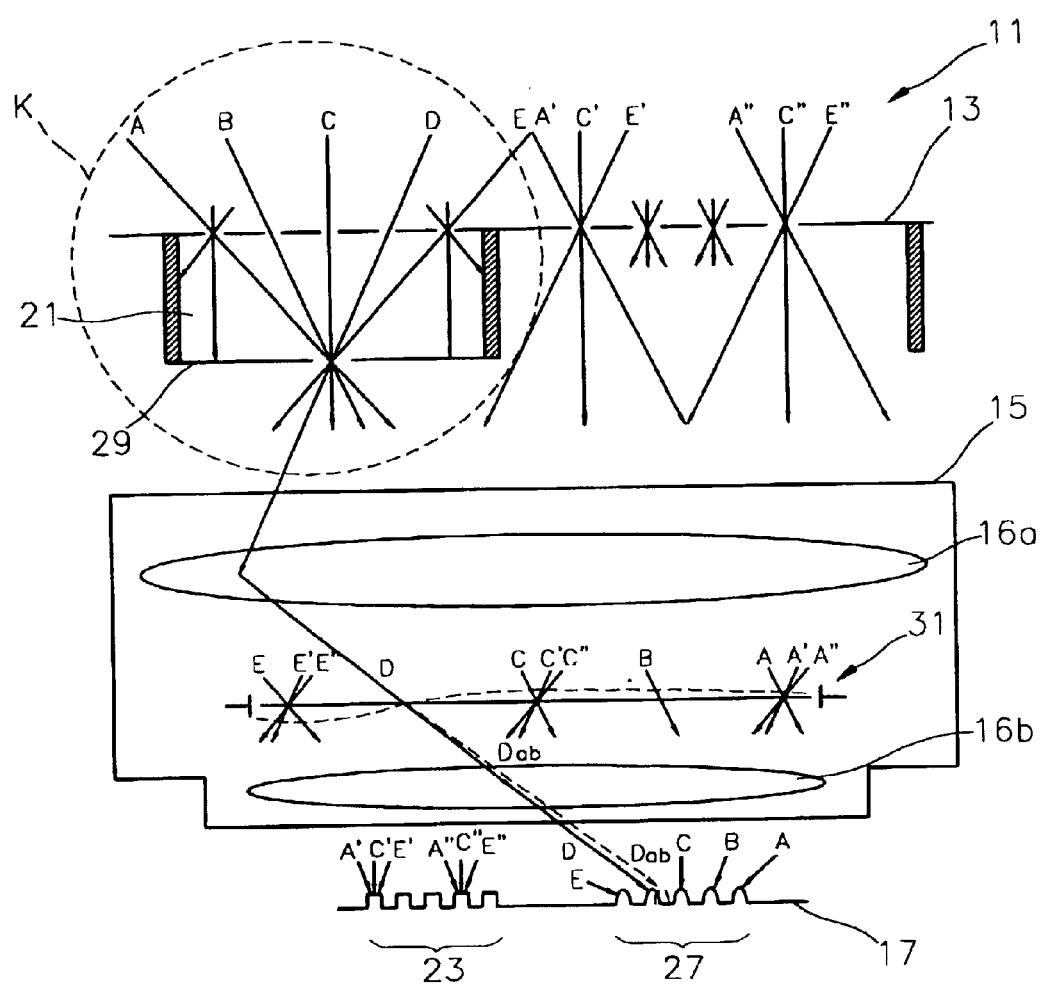
FIG. 1 is an illustration of a conventional method for estimating aberration in a projection lens system of an exposure apparatus.
Figure 2:
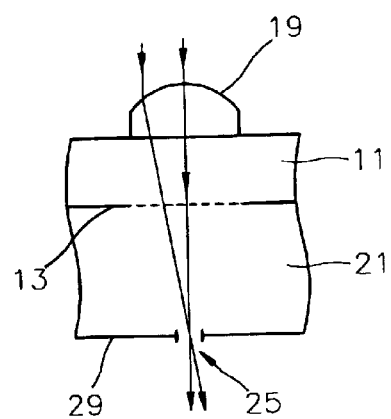
FIG. 2 is an enlarged view of the portion "K" of FIG. 1.
Figure 3:
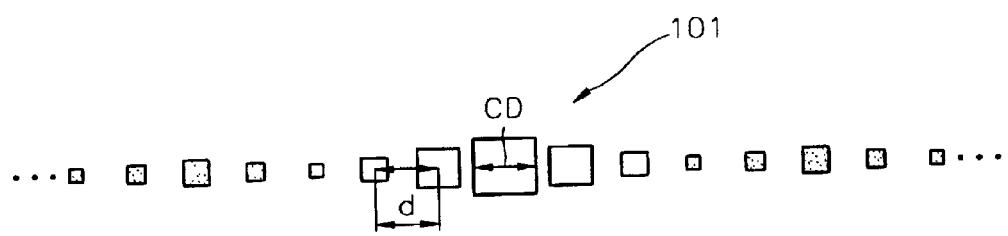
FIG. 3 is a one-dimensional plan view of a mask for estimating aberration in a projection lens system of an exposure apparatus according to an exemplary embodiment of the present invention.
Figure 4:
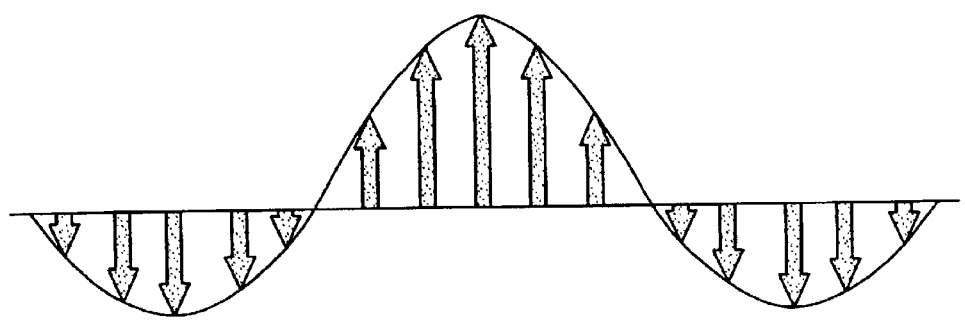
FIG. 4 is a graphical illustration of a SINC function of the sizes of mask patterns shown in FIG. 3.

Referring now to FIG. 3, a one-dimensional plan view of a mask for estimating aberration in a projection lens system of an exposure apparatus according to an exemplary embodiment of the present invention can best be seen. In particular, the mask for estimating aberration in a projection lens system of the exposure apparatus according to an exemplary embodiment of the present invention includes mask patterns 101, as shown in FIG. 3. The hatched portion of the mask patterns 101 is a mask pattern for changing the phase of light by 180 degrees. The mask patterns 101 for changing the phase of light may be formed by etching the mask substrate, i.e., a glass substrate. A critical dimension (CD), which is represented by the width of each of the mask patterns 101, and a phase of the mask patterns have a size proportional to a SINC function, i.e., SINC(X)=SIN(X)/X, as illustrated in FIG. 4. That is, the sizes of the mask patterns 101 shown in FIG. 3 are SIN values at points corresponding to the arrows illustrated in FIG. 4. The phase of each of the mask patterns may be provided by etching the substrate. Further, the distance (d) between the centers of the respective mask patterns 101 may be substantially uniform.

FIG. 3. depicts a one-dimensional representation of the mask patterns 101 on the mask for estimating aberration. Although the mask patterns 101 can be shown in a two-dimensional representation, the shapes of the mask patterns 101 may be substantially uniform, as shown in FIG. 3. In other words, a CD that can also be two-dimensionally represented by the width of each of the mask patterns 101 has a SINC function shape.

Figure 5:
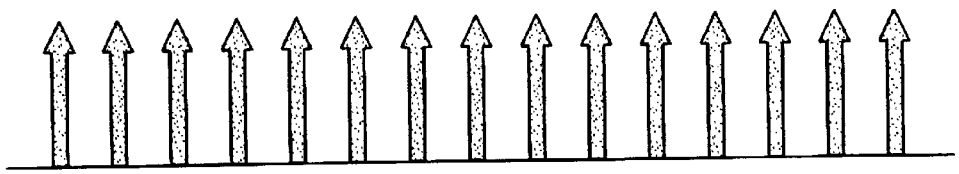
FIG. 5 is a graphical illustration of the size and phase of light transmitted to the projection lens system when the mask for estimating aberration in the projection lens of the exposure apparatus shown in FIG. 3 is used.

FIG. 5 is a graph illustrating the size and phase of light transmitted to the projection lens system when the mask illustrated in FIG. 3 is used. In particular, when the mask for estimating aberration shown in FIG. 3 is used, the size and phase of light transmitted to the projection lens system during an exposure step may be substantially uniform, as is shown in FIG. 5. In particular, an aberration value in each portion of the projection lens system depending on each of the mask patterns 101 is not distorted and may be substantially uniform. The actual aberration value may be extracted by comparing a center distance between photoresist patterns transferred from the mask patterns 101 on the semiconductor wafer with a center distance between the mask patterns 101 for estimating aberration. However, unlike in the mask shown in FIG. 3, when mask patterns 101 having substantially identical sizes are arranged at a substantially uniform interval, the intensity and phase of beams transmitted to the projection lens system are not substantially uniform.

As described above, a mask for estimating aberration in the projection lens system of an exposure apparatus according to one exemplary embodiment includes mask patterns 101 arranged on the mask substrate such that a critical dimension (CD), represented by the width of each of the mask patterns 101 and a phase of the mask patterns have a size proportional to a SINC function, i.e. SINC(X)=SIN(X)/X. In addition, the distance (d) between the centers of the mask patterns 101 may be substantially uniform. When such a mask for estimating aberration in the projection lens system of an exposure apparatus is used, the size and phase of light transmitted to the projection lens system during the exposure step are substantially uniform such that the aberration value in each portion of the projection lens system depending on each of the mask patterns 101 is not distorted and is substantially uniform.

While this invention has been particularly shown and described with reference to preferred exemplary embodiments thereof, it will be understood by those skilled in the art that various changes in form and details may be made therein without departing from the spirit and scope of the invention as defined by the appended claims.

What is claimed is:

1. A mask for estimating aberration in a projection lens system of an exposure apparatus comprising:
mask patterns arranged on a mask substrate such that a critical dimension and a phase of said mask patterns have a size proportional to a SINC function, said critical dimension being represented by the width of each of said mask patterns.

2. The mask of claim 1, wherein a distance between centers of said mask patterns is substantially uniform.

3. The mask of claim 1, wherein said phase of each of said mask patterns is provided by etching said mask substrate.

4. The mask of claim 1, wherein the shape of said mask patterns is substantially uniform.

5. The mask of claim 1, wherein said mask patterns do not have a substantially uniform size.

6. The mask of claim 1, wherein a size and phase of light transmitted to said projection lens system during exposure are substantially uniform.

7. The mask of claim 1, wherein an aberration value is obtained by comparing a center distance between photoresist patterns transferred from said mask patterns to a semiconductor wafer with a center distance between said mask patterns.

8. The mask of claim 7, wherein said center distance between said photoresist patterns is a distance measured from the center of a first photoresist pattern to the center of a second photoresist pattern and said center distance between said mask patterns is a distance measured from the center of a first mask pattern to the center of a second mask pattern.

9. The mask of claim 8, wherein said aberration value in each portion of said projection lens system depending on said mask patterns is not substantially distorted and is substantially uniform.

10. A method for estimating aberration in a projection lens system of an exposure apparatus comprising:
measuring a center distance between photoresist patterns transferred from mask patterns to a semiconductor wafer, said mask patterns being arranged such that a critical dimension and a phase of said mask patterns have a size proportional to a SINC function;
measuring a center distance between said mask patterns;
comparing said center distance between said photoresist patterns to said center distance between said mask patterns to obtain an aberration value.

11. The method of claim 10, wherein said center distance between said photoresist patterns is a distance measured from the center of a first photoresist pattern to the center of a second photoresist pattern and said center distance between said mask patterns is a distance measured from the center of a first mask pattern to the center of a second mask pattern.

12. The method of claim 11, wherein said aberration value in each portion of said projection lens system is not substantially distorted and is substantially uniform.

13. The method of claim 12, wherein said mask patterns do not have a substantially uniform size.

14. The method of claim 13, wherein the size and phase of light transmitted to said projection lens system during exposure are substantially uniform.

15. The method of claim 10, wherein said critical dimension is represented by the width of each of said mask patterns.

* * * * *